US 8,311,500 B2

(12) United States Patent  (10) Patent No.: US 8,311,500 B2
Hirama  (45) Date of Patent: Nov. 13, 2012

(54) WIRELESS COMMUNICATION DEVICE

(75) Inventor: Atsuhiro Hirama, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 1068 days.

(21) Appl. No.: 12/246,740

(22) Filed: Oct. 7, 2008

(65) Prior Publication Data

US 2009/0239481 A1  Sep. 24, 2009

(30) Foreign Application Priority Data

Mar. 21, 2008  (JP) .................................. 2008-074124

(51) Int. Cl.
H04B 7/00 (2006.01)
H04B 1/06 (2006.01)
H04B 17/00 (2006.01)

(52) U.S. Cl. ................ 455/232.1; 455/67.16; 455/226.2; 455/234.1

(58) Field of Classification Search .......... 455/134–136, 455/232.1–245, 67.11, 67.16, 226.1–226.4; 375/345

See application file for complete search history.

(56) References Cited

U.S. PATENT DOCUMENTS

| 5,361,395 | A  | * | 11/1994 | Yamamoto ..................... 455/436 |
| 5,617,060 | A  |   | 4/1997  | Wilson |
| 6,847,261 | B2 | * | 1/2005  | Iwata et al. .................... 330/279 |
| 7,076,223 | B2 | * | 7/2006  | Matsugatani et al. ...... 455/232.1 |
| 7,113,758 | B2 | * | 9/2006  | Kishi ........................... 455/234.1 |
| 7,149,263 | B2 | * | 12/2006 | Higure .......................... 375/345 |
| 7,171,185 | B2 | * | 1/2007  | Matsumoto et al. .......... 455/324 |
| 7,397,872 | B2 | * | 7/2008  | Komori et al. ................ 375/345 |
| 2001/0044287 | A1 | * | 11/2001 | Iwata et al. ................. 455/245.1 |
| 2003/0025623 | A1 | * | 2/2003  | Brueske et al. ............... 341/139 |
| 2003/0026363 | A1 | * | 2/2003  | Stoter et al. ................... 375/345 |
| 2005/0281226 | A1 |   | 12/2005 | Lee et al. |
| 2006/0121928 | A1 |   | 6/2006  | Itsuki |

FOREIGN PATENT DOCUMENTS

| EP | 0 755 133 | 1/1997 |
| EP | 1170860 | 1/2002 |
| EP | 1296449 | 3/2003 |
| EP | 1667321 | 6/2006 |
| JP | 05-199137 | 8/1993 |
| JP | 08-274558 | 10/1996 |

(Continued)

OTHER PUBLICATIONS

Partial European Search Report for corresponding European Patent Application No. 08165940.1, dated Apr. 1, 2010.

(Continued)

Primary Examiner — Simon Nguyen
(74) Attorney, Agent, or Firm — Myers Wolin, LLC

(57) ABSTRACT

A wireless communication device that obtains an analog received signal by receiving a wireless signal, adjusts amplitude by a variable gain amplifier, converts the analog received signal into a digital received signal by an A/D converter and obtains user data by demodulating the digital received signal, including: a received signal strength indication detecting section that detects a received signal strength indication that fluctuates over time; a gain controlling section that controls a gain of the variable gain amplifier; a propagation environment judging section that judges a propagation environment level of the wireless signal, and a time constant controlling section that controls a time constant, based on the judged propagation environment level such that the time constant becomes larger as the propagation environment level becomes lower, the time constant regulating a change speed of the gain at the variable gain amplifier.

4 Claims, 4 Drawing Sheets

FOREIGN PATENT DOCUMENTS

| | | |
|---|---|---|
| JP | 2001-189692 | 7/2001 |
| JP | 2002-290176 | 10/2002 |
| JP | 2003-078469 | 3/2003 |
| JP | 2004-064525 | 2/2004 |
| WO | 03/094565 | 11/2003 |

OTHER PUBLICATIONS

Extended European Search Report issued for corresponding European Patent Application No. 08165940.1, dated Mar. 4, 2011.

* cited by examiner

WIRELESS COMMUNICATION DEVICE

CROSS-REFERENCE TO RELATED APPLICATION

This application is based upon and claims the benefit of priority of the prior Japanese Patent Application No. 2008-074124, filed on Mar. 21, 2008, the entire contents of which are incorporated herein by reference.

FIELD

An embodiment discussed herein is directed to a wireless communication device and a method of the same that obtains analog received signals by receiving wireless signals, adjusts amplitude by a variable gain amplifier, converts the analog received signals into digital received signals by an A/D converter, and obtains user data by demodulating the digital received signals.

BACKGROUND

In recent years, wireless communication techniques have remarkably advanced and with the advancement of the wireless communication techniques, wireless communication terminals such as mobile phones have greatly advanced as well.

Here, in the wireless communication system including the wireless communication terminals, with a high-speed move of the wireless communication terminals, Rayleigh fading is caused and a received signal level fluctuates to a great extent of about 50 to 60 dB. This fluctuation causes problems of demodulation error and degradation in error rate due to the increase in quantization error at the time of AD conversion. Because of this, for wireless communication devices, an automatic gain control device is required to compensate for change in received signal levels.

Broadly speaking, among automatic gain control methods adopted in the automatic gain control devices, feedback gain control method and feedforward gain control method are known.

Since the feedback gain control method controls so as to make deviation between a control target value and a controlled actual value zero, therefore while the method has the advantage of high accuracy, it has the drawback of slow response speed because control operation starts only after the deviation is generated. Japanese Laid-open Patent Publication (JP-P) No. 5-199137 discloses a method for controlling a time constant of a main signal system AGC driver circuit by detecting fluctuation of wireless received signal level in an electric field sudden fluctuation detection circuit. However, this technique in the JP-P No. 5-199137 adopts the feedback gain control method and thus there is an inherent fundamental problem of the feedback gain control method that the response speed is slow.

On the other hand, the feedforward gain control method has a merit of fast response speed, since it can detect fluctuations of received signals at once by using a received signal strength indication (RSSI) and perform gain control. However, the characteristic of the received signal strength indication (RSSI) often does not match the characteristic of the automatic gain control, and thus there is a problem that performing control with high precision is difficult.

Japanese Laid-open Patent Publication No. 8-274558 proposes a feedforward gain control method employing double loop control in which two variable gain amplifiers are arranged in series and a logarithmic amplify detecting output in a single received signal strength indication detecting circuit is inputted into two time constant circuits having two large and small time constants, to control a gain of two variable gain amplifiers. The gain control method in this JP-P No. 8-274558 has a merit of fast response speed since it is basically a feedforward gain control method. However, since an AGC control loop with a large time constant is set in the front and an AGC control loop with a small time constant is set in the back, thereby sudden fluctuations of received signal level pass through the front and causes large fluctuation of input amplitude in the back, and thus there still remains the drawback of the feed forward gain control method that it lacks stability in control.

In addition to the above-described JP-P Nos. 5-199137 and 8-274558, techniques such as the Japanese Laid-open Patent Publication Nos. 2003-78469, 2001-189692, 2004-64525, and 2002-290176 are also disclosed. However, the characteristic of JP-P No. 2003-78469 lies not in the control of AGC time constant, but in a receive-timing detection circuit. Also, the technique in JP-P No. 2001-189692 aims to perform gain control with great precision, by removing an interference signal I from received signals at the time of performing the gain control and by controlling the gain only with hope S wave and noise N wave, which is nothing but the control of gain control value. JP-P No. 2004-64525 also aims to control the gain control value in the same way as in JP-P No. 2001-189692, by employing the feedback method and the feedforward method together. Further, a technique disclosed in JP-P No. 2002-290176 is an idea for obtaining a gain control value to perform AGC by an overflow/underflow detection section and an UP/Down counter. In this way, the techniques in these JP-P Nos. 2003-78469, 2001-189692, 2004-64525, and 2002-290176 should not be compared directly with the technique of the present invention to be described later.

SUMMARY

According to an aspect of the invention, a wireless communication device that obtains an analog received signal by receiving a wireless signal, adjusts amplitude by a variable gain amplifier, converts the analog received signal into a digital received signal by an A/D converter and obtains user data by demodulating the digital received signal, the wireless communication device includes: a received signal strength indication detecting section that detects a received signal strength indication that fluctuates over time, based on the analog received signal; a gain controlling section that controls a gain of the variable gain amplifier, based on the received signal strength indication that fluctuates over time, detected in the received signal strength indication detecting section; and a time constant controlling section that controls a time constant, based on the propagation environment level judged by the propagation environment judging section such that the time constant becomes larger as the propagation environment level becomes lower, the time constant regulating a change speed of the gain at the variable gain amplifier, based on the received signal strength indication that fluctuates over time, detected by the received signal strength indication detecting section.

An object and advantages of the invention will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF EMBODIMENT(S)

An embodiment of the present invention will be described below with reference to the accompanying drawings.

Figure 1:
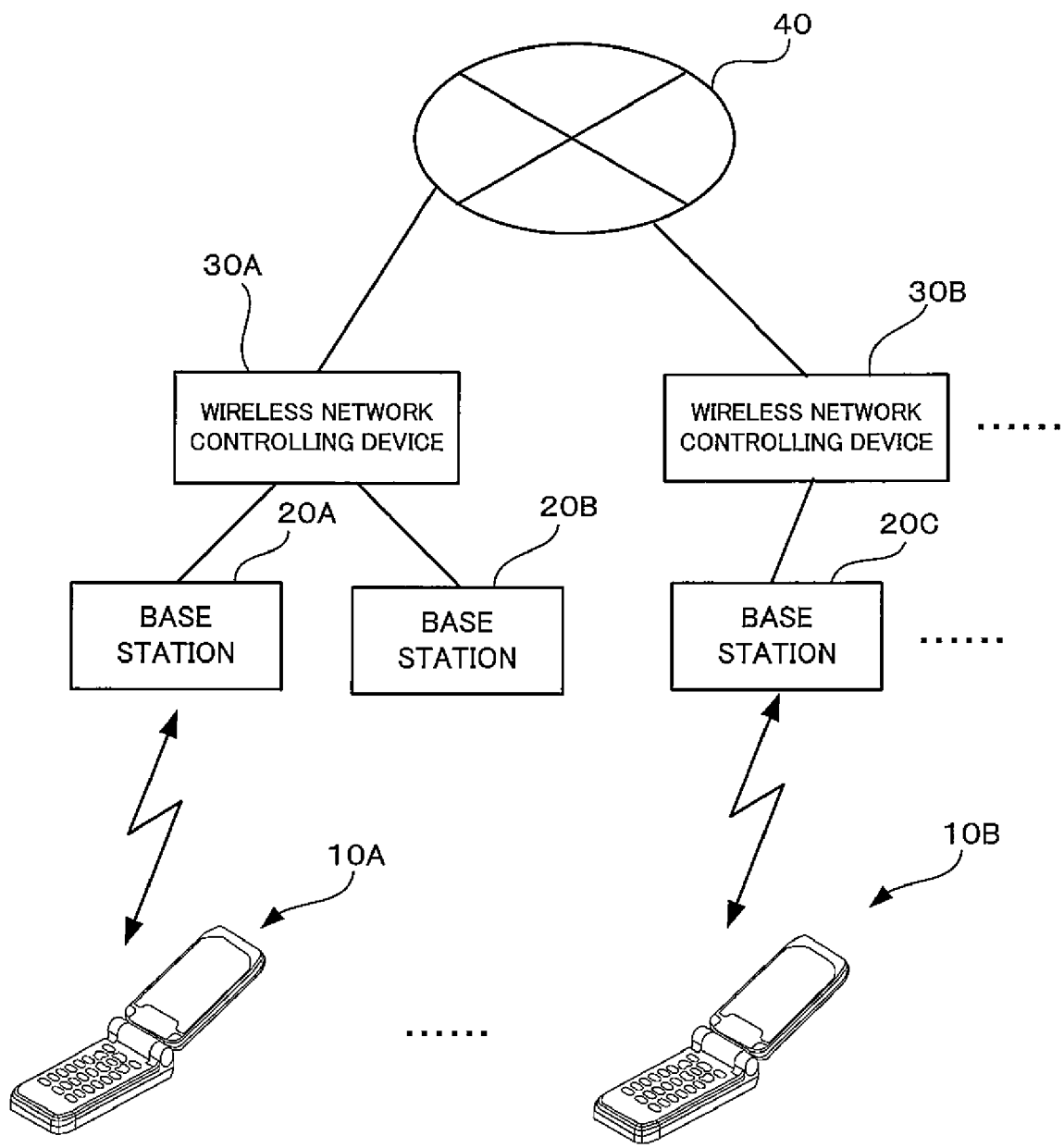
FIG. 1 is a schematic drawing of a wireless communication system.

FIG. 1 is a schematic drawing of a wireless communication system.

Here, plural wireless communication terminals 10A, 10B, . . . , and plural base stations 20A, 20B, 20C, . . . are illustrated and the wireless communication terminals 10A, 10B performs wireless communication with any of the base stations in response to its moving positions. Each base station 20A, 20B, 20C is connected to a communication network 40 via any of the wireless network controlling devices 30A, 30B, thereby communication can be performed between the wireless communication terminals 10A and 10B via the communication network 40.

Here, each of the wireless communication terminals 10A, 10B, . . . , and each of the base stations 20A, 20B, 20C, . . . , corresponds to one embodiment of the wireless communication device disclosed in the present invention.

Figure 2:
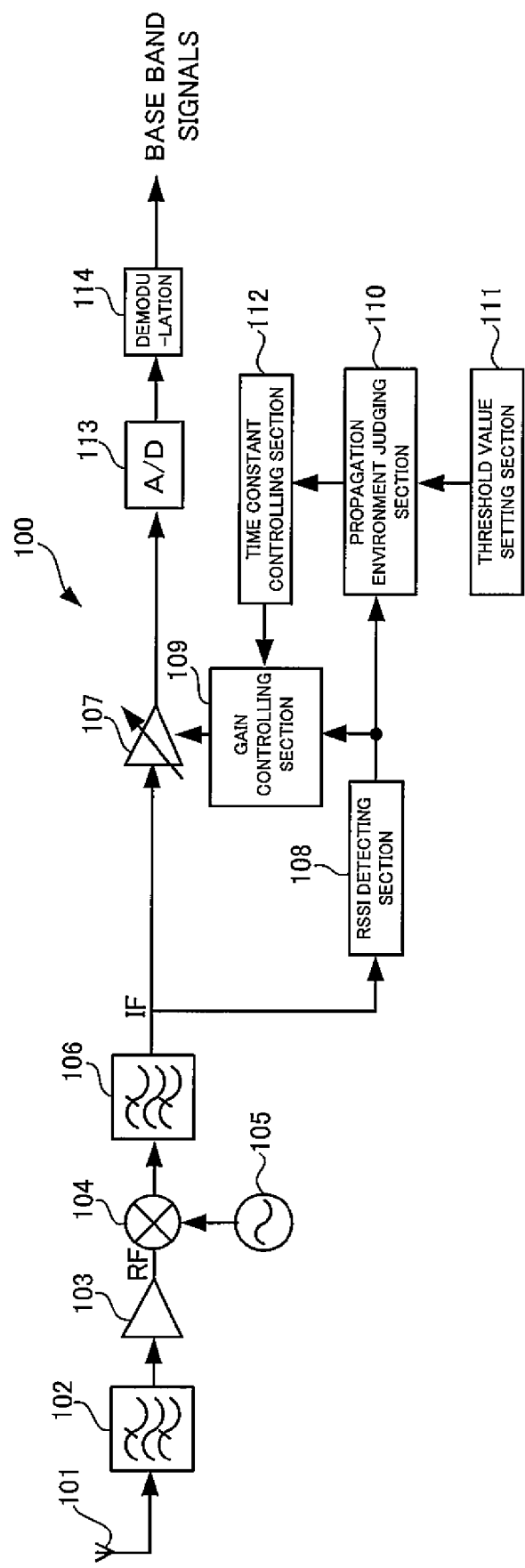
FIG. 2 is a block diagram mainly depicting a gain control section for received signals in a receive circuit of the wireless communication device according to the present embodiment.

FIG. 2 is a block diagram mainly depicting a gain control section for received signals in a receive circuit of the wireless communication device according to the present embodiment.

Wireless signals are received at a receive antenna 101 of this wireless communication device 100 and through a passband filter 102 that passes only in-band received signals and an amplifier 103, received signals within a radio frequency (RF) band can be obtained. The received signals within this RF band are inputted into a mixer 104, then mixed with oscillation signals from a local oscillator 105 and further converted into received signals within an intermediate frequency (IF) band through a filter 106 that removes unnecessary signals included in the output of the mixer 104. The received signals within this IF band is inputted into a variable gain amplifier 107 and a received signal strength indication (RSSI) detecting section 108. In this RSSI detecting section 108, a received signal strength indication is detected based on the received signals, and the detected received signal strength indication is notified to a gain controlling section 109 and a propagation environment judging section 110.

In the propagation environment judging section 110, based on the received signal strength indication notified from the RSSI detecting section 108 and a threshold value notified from a threshold value setting section 111, a judgment of propagation environment level of radio waves is made and its judged result is notified to a time constant controlling section 112. In this time constant controlling section 112, based on the judged result of the propagation environment level notified from the threshold value setting section 110, a time constant for regulating a change speed of a gain in the gain controlling section 109 is controlled. In the gain controlling section 109, based on the received signal strength indication notified from the RSSI detecting section 108 and also at the change speed of the gain in response to the time constant controlled by the time constant controlling section 112, the gain at the variable gain amplifier 107 is controlled.

Here, the time constant controlling section 112 controls the time constant so as to become large when a propagation environment level is low. Therefore, when the propagation environment is stable (when the propagation environment level is high), the gain controlling section 109 controls a gain of the variable gain amplifier 107 at a fast response speed, whereas when the propagation environment is unstable (when the propagation environment level is low), the gain controlling section 109 controls a gain of the variable gain amplifier 107 steadily so that the gain is not influenced by the unstable propagation environment. With this, the gain of the variable gain amplifier 107 can be controlled rapidly and steadily.

The received signals having passed through this variable gain amplifier 107 are converted into digital received signals by an A/D converter 113 and inputted into a demodulation circuit 114 by which base band signals are extracted from the digital received signals. The base band signals are inputted into a correction circuit or the like (not shown) in a subsequent stage, and control data and user date are extracted therefrom.

Figure 3:
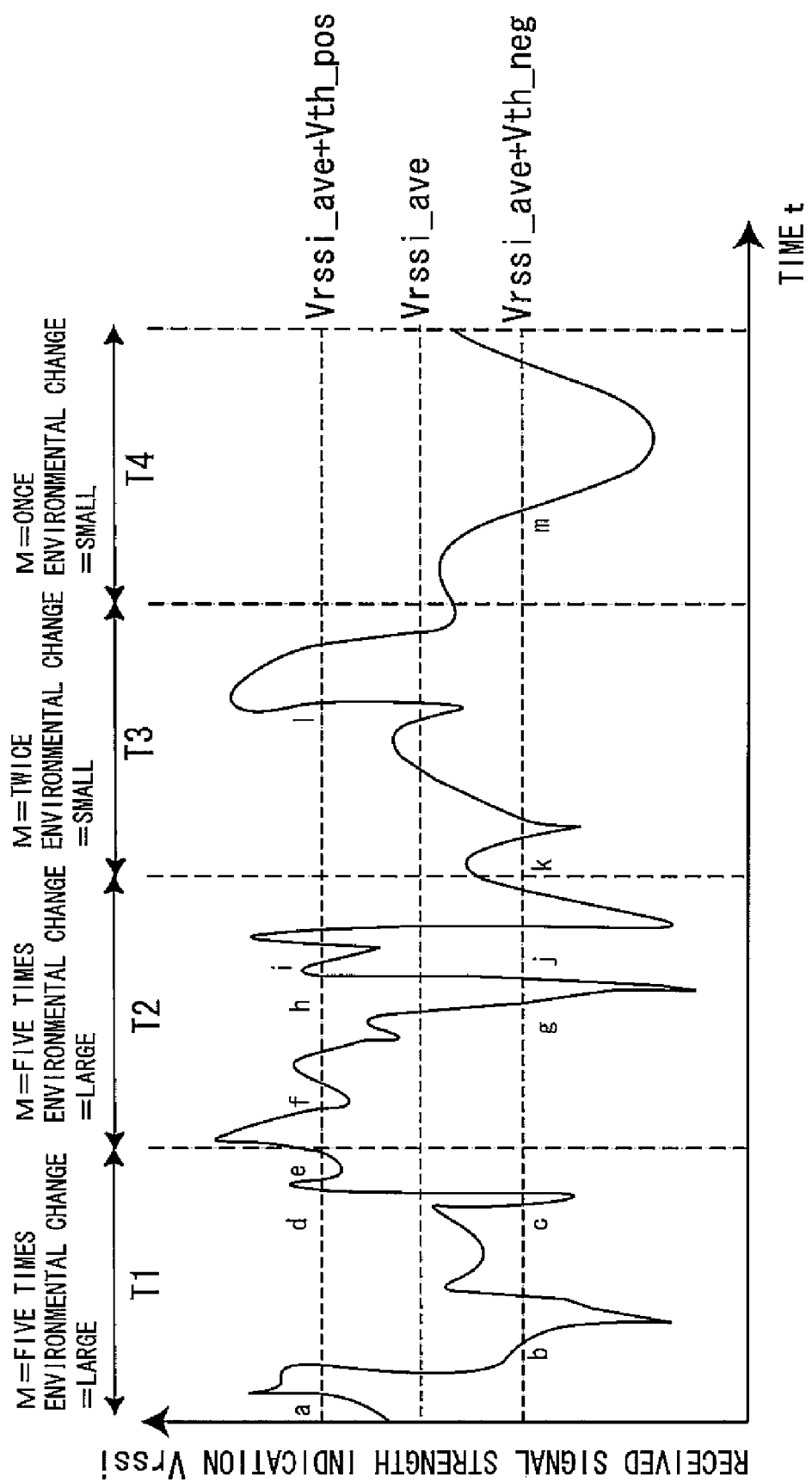
FIG. 3 is a drawing depicting a judging algorithm of propagation environment level by a propagation environment judging section in FIG. 2.

FIG. 3 is a drawing depicting a judging algorithm of propagation environment level by a propagation environment judging section in FIG. 2.

In this FIG. 3, the horizontal axis indicates time t, and the vertical axis indicates a received signal strength indication Vrssi.

Further, this FIG. 3 also illustrates a current average received signal strength indication Vrssi_ave notified from the RSSI detecting section 108 and threshold values Vth_pos, Vth_neg, notified from the threshold value setting section 111.

The curve indicated in actual line in FIG. 3 depicts a received signal strength indication that varies over time, and here, by diving into segments T1, T2, . . . , per predetermined unit hour, a count is taken in each unit hour by counting the number of times where the received signal strength indication Vrssi deviates from a received signal strength indication range sandwiched between a plus side threshold value Vth_pos of the average received signal strength indication Vrssi_ave and a minus side threshold value Vth_neg of the average received signal strength indication Vrssi_ave.

In this example of FIG. 3, in the first segment of unit hour T1, the deviation occurs five times at the times a, b, c, d and e (M=5), and in the next segment T2, five times at the times f, g, h, i and j (M=5), and further in the next segment T3, twice at the times k and l (M=2), and furthermore in the next segment T4, only once at the time m (M=1). Here, M=3 is set as a threshold value to determine whether environmental change is large or small, and in this case, segments T1 and T2 are determined as having large environmental change, while T3 and T4 are determined as having small environmental change.

As described above, this judged result is notified from the propagation environment judging section 110 to the time constant controlling section 112, and this time constant controlling section 112 controls a time constant for gain control such that it becomes large when a judged result of large environmental change in the gain controlling section 109 is notified, whereas it becomes small when a judged result of small environmental change is notified. This ensures both fast responsiveness and stability of gain at the variable gain amplifier 108, as described above.

In addition, in this FIG. 3, the explanation is made about the example of judging the environmental change into two large and small levels for the sake of simplification. However, the propagation environment judging section 110 may be configured to make a judgment into more levels.

Figure 4:
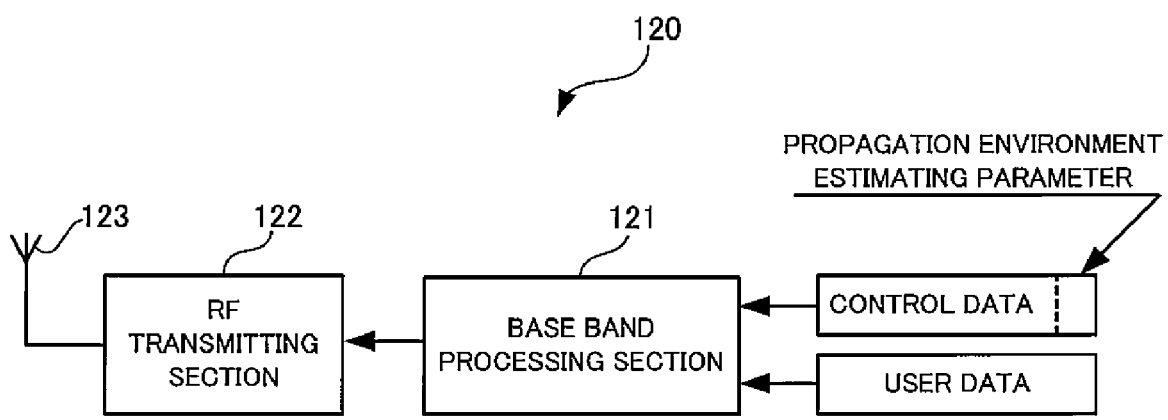
FIG. 4 is a block diagram schematically illustrating a transmitting section of the wireless communication device according to the present embodiment.

FIG. 4 is a block diagram schematically illustrating a transmitting section 120 of the wireless communication device according to the present embodiment.

The control data and user data is inputted into a base band processing section 121 to process for transmission, which is sent to a RF transmitting section 122 for being converted into RF signals or the like and then emitted as radio waves via a transmission antenna 123. This transmission antenna 123 may be shared with the receive antenna 101 shown in FIG. 2.

Here, the control data to be inputted into the base band processing section 122 contains in its portion a propagation environment estimating parameter representing a judged result of the propagation environment level in the propagation environment judging section 110 illustrated in FIG. 2, and is transmitted toward a wireless communication device at the other end in the current communication.

Therefore, the wireless communication device on the other end can receive the propagation environment estimating parameter and perform communication controls such as limiting the amount of transmitting data by taking the propagation environment estimating parameter into consideration, which contributes to further improvement of the stability of wireless communication.

Here, with reference to FIG. 3, the number of instances deviating from the received signal strength indication range sandwiched between the upper and lower the threshold values is counted for each segment T1, T2, . . . respectively, and according to the number, environmental change is determined as large or small. However, it is also possible to determine the environmental change as large or small by other algorithms, for example, such as monitoring the inclination of signals when the signals traverse Vrssi_ave and counting the number of times when the signals traverse at not less than a predetermined inclination.

As explained above, according to the wireless communication device and the method of the same disclosed in the present invention, it is possible to attain a high level of responsiveness and stability of gain control of received signals at the same time.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention have been described in detail, it should be understood that the various changes, substitutions, and alterations could be made hereto without departing from the spirit and scope of the invention.

What is claimed is:

1. A wireless communication device that obtains an analog received signal by receiving a wireless signal, adjusts amplitude by a variable gain amplifier, converts the analog received signal into a digital received signal by an A/D converter and obtains user data by demodulating the digital received signal, the wireless communication device comprising:

a received signal strength indication detecting section that detects a received signal strength indication that fluctuates over time, based on the analog received signal;

a gain controlling section that controls a gain of the variable gain amplifier, based on the received signal strength indication that fluctuates over time, detected in the received signal strength indication detecting section;

a propagation environment judging section that judges a propagation environment level of the wireless signal, based on the received signal strength indication that fluctuates over time, detected by the received signal strength indication detecting section;

a time constant controlling section that controls a time constant, based on the propagation environment level judged by the propagation environment judging section such that the time constant becomes larger as the propagation environment level becomes lower, the time constant regulating a change speed of the gain at the variable gain amplifier, based on the received signal strength indication that fluctuates over time, detected by the received signal strength indication detecting section; and a threshold value setting section that sets upper and lower limit threshold values for a received signal strength indication, wherein the propagation environment judging section counts per unit hour the number of instances where the received signal strength indication detected by the received signal strength indication detecting section deviates from an intensity range sandwiched between the upper and lower limit threshold values set by the threshold value setting section, and judges a propagation environment level per the unit hour in response to the counted number.

2. The wireless communication device according to claim 1, further comprising a transmitting section that transmits the propagation environment level judged by the propagation environment judging section toward a wireless communication device at the other end communicating with the wireless communication device.

3. A wireless communication method that obtains an analog received signal by receiving a wireless signal, adjusts amplitude by a variable gain amplifier, converts the analog received signal into a digital received signal by an A/D converter and obtains user data by demodulating the digital received signal, the wireless communication method comprising:

detecting a received signal strength indication that fluctuates over time, based on the analog received signal;

judging a propagation environment level of the wireless signal, based on the received signal strength indication that fluctuates over time, detected in the received signal strength indication detecting; and controlling a gain at the variable gain amplifier, based on the received signal strength indication that fluctuates over time, detected in the received signal strength indication detecting, the gain controlling which controls a time constant that regulates a change speed of the gain at the variable gain amplifier, based on the received signal strength indication that fluctuates over time, detected in the received signal strength indication detecting, based on the propagation environment level judged in the propagation environment judging such that the time constant becomes larger as the propagation environment level becomes lower, wherein the propagation environment judging counts per unit hour the number of instances where the received signal strength indication detected in the detecting deviates from the intensity range sandwiched between upper and lower limit threshold values, and judges a propagation environment level per the unit hour in response to the counted number.

4. The wireless communication method according to claim 3, further comprising:

transmitting the propagation environment level judged in the propagation environment judging toward a wireless communication device in communication at the other end.

* * * * *